United States Patent
Frerking

(10) Patent No.: US 6,545,550 B1
(45) Date of Patent: Apr. 8, 2003

(54) RESIDUAL FREQUENCY EFFECTS COMPENSATION

(76) Inventor: Marvin E. Frerking, 279 Crandall Dr. NE., Cedar Rapids, IA (US) 52402

( * ) Notice: Subject to any disclaimer, the term of this patent is extended or adjusted under 35 U.S.C. 154(b) by 83 days.

(21) Appl. No.: 09/833,983

(22) Filed: Apr. 13, 2001

(65) Prior Publication Data (65)

Related U.S. Application Data
(60) Provisional application No. 60/218,522, filed on Jul. 17, 2000.

(51) Int. Cl.$^7$ .............................................. G01R 23/00
(52) U.S. Cl. ......................................... 331/44; 331/162
(58) Field of Search ............................. 331/44, 176, 66, 331/46–48, 50, 175, 74, 34, 1 R, 162

(56) References Cited

U.S. PATENT DOCUMENTS

| | | | |
|---|---|---|---|
| 3,875,533 A | 4/1975 | Irwin | 331/116 |
| 4,539,532 A | 9/1985 | Vig | 331/69 |
| 4,859,969 A | 8/1989 | Malinowski et al. | 331/43 |
| 4,872,765 A | 10/1989 | Schodowski | 374/117 |
| 5,004,987 A | 4/1991 | Hurley | 331/70 |
| 5,041,800 A | 8/1991 | Long et al. | 331/69 |
| 5,208,558 A | 5/1993 | Shigehara et al. | 331/116 |
| 5,331,296 A | 7/1994 | Davis | 331/158 |
| 5,459,436 A | 10/1995 | Pucci et al. | 331/66 |
| 5,668,506 A | 9/1997 | Watanabe et al. | 331/66 |
| 5,777,524 A | 7/1998 | Wojewoda et al. | 331/116 |
| 5,781,073 A | 7/1998 | Mii | 331/44 |
| 5,801,594 A | 9/1998 | Muto et al. | 331/158 |
| 5,844,448 A | 12/1998 | Jackoski et al. | 331/158 |

OTHER PUBLICATIONS

Shmaliy, et al., "Thermal Transient Studies of Anharmonic Sensors of Aging of Precision AT–Cut Crystal Resonators"
Tsarapkin, D., "Novel Technique For Dual–Mode Quartz Oscillators", (Advanced Copy) Paper present at IEEE Frequency Control Symposium, Jun. 8, 2000.
Frerking, M. E., *Crystal Oscillator Design and Temperature Compensation*, Van Nostrand Reinhold, 1978, pp. 152–176.
Benjaminson et al. "A Microcomputer–Compensated Crystal Oscillator Using a Dual–Mode Resonator" 43rd Annual Symposium on Frequency Control—1989, p. 20–26.*

* cited by examiner

Primary Examiner—Robert Pascal
Assistant Examiner—Joseph Chang

(57) ABSTRACT

A means is provided to estimate the amount of frequency deviation experienced in a precision resonator resulting from the effects of previous thermal history, acceleration, or aging by determining the differential effect of the perturbing condition on different resonant modes in the same resonator or on different resonators exposed to the same environment. The measurements may be made simultaneously, or sequentially against an independent frequency source. Residual frequency hysteresis effects may be determined in connection with an independent temperature sensor if the exact temperature in not known.

20 Claims, 4 Drawing Sheets

RESIDUAL FREQUENCY EFFECTS COMPENSATION

CROSS-REFERENCE TO RELATED APPLICATIONS

This application claims the benefit of Ser. No. 60/218,522, filed Jul. 17, 2000.

BACKGROUND-FIELD OF INVENTION

The invention relates to electrical oscillations, and in particular to crystal oscillators where the frequency may be slightly perturbed by factors such as the past thermal history, acceleration, or time such as aging.

BACKGROUND-DESCRIPTION OF PRIOR ART

Temperature compensated crystal oscillators (TCXO) and oven controlled crystal oscillators (OCXO) are well known in the art, see for example: *Crystal Oscillator Design and Temperature Compensation*, by Marvin E. Frerking, Van Nostrand Reinhold, 1978. In a Digitally Temperature Compensated Crystal Oscillator, the temperature is measured by a temperature sensor and converted to digital form by an A/D converter. A thermistor of other resistance that is variable with temperature may be used as the sensor. Other means such as temperature sensitive IC's may be used as the sensor. The memory of the microcomputer is programmed to store the temperature characteristics of the reference crystal, usually at specific fixed temperatures. The temperature in digital form is used to address the memory. The closest stored values are used for interpolation to find the correction required at the exact ambient temperature being measured. The compensation value is then converted to an analog voltage by a D/A converter and applied to a voltage variable element in the oscillator to correct its frequency. Using this technique, however, residual effects tend to limit the ultimate accuracy that can be achieved. For example in a temperature compensated crystal oscillator, the accuracy of the compensation is limited by frequency hysteresis resulting from the past thermal history of the crystal, e.g. the frequency at a given temperature is slightly different depending on whether the crystal has been cold or hot last, how long ago, and the extent of the temperature excursion.

In the case of oven controlled crystal oscillators, the frequency may be slightly different after the unit is turned off and on again allowing the crystal to see a significantly different temperature while the unit is turned off. It is also well known that the frequency of a crystal resonator gradually changes with time (aging).

Another residual effect in crystal oscillators is due to orientation in the earth's gravitational field which may limit the accuracy of a precision oscillator.

Heretofore, there has been no effective means of internally sensing these residual effects and compensating for them, particularly the effects of temperature hysteresis. In some applications it has been possible to predict the crystal aging rate by observing it compared it to an external standard for a period of time, and then by assuming that the aging rate remains constant, correct for it after the external standard is removed for a short period of time. This is only effective if the aging rate is fairly constant and the crystal temperature does not change. Some experimental compensation for aging has been done by sensing the frequency difference between the desired mode and a closely spaced anharmonic mode by modulating the oscillator to sense the anharmonic resonance frequency. There has been no effective way, however, to predict and compensate for hysteresis effects.

In the subject invention, as will be described subsequently, it will be noted that these hysteresis effects in modes significantly separated in frequency or vibrating in a different way are not necessarily affected in exactly the same way, therefore, it is possible to use these differential effects as a hysteresis sensor, or aging sensor and compensate for them to some extent thus improving the overall accuracy.

SUMMARY

The present invention consists of the use of multiple modes of oscillation in a crystal oscillator either simultaneously or sequentially that are affected differently by hysteresis, aging, or acceleration so that by measuring the change in differential frequencies, a proportional correction can be made to the main mode and improve the frequency accuracy. When sequential frequency modes are used, a second oscillator against which frequency measurements are made is required. The technique can also be applied with multiple oscillators rather than multiple modes of the same resonator when the oscillators are exposed to the same environment.

The invention is applicable to temperature compensated crystal oscillators and to oven controlled crystal oscillators.

DRAWINGS FIGURES

In order that the invention may be readily carried into practice, a number of embodiments will be described in detail using the accompanying drawings in which.

DETAILED DESCRIPTION OF PREFERRED EMBODIMENT

Figure 1:
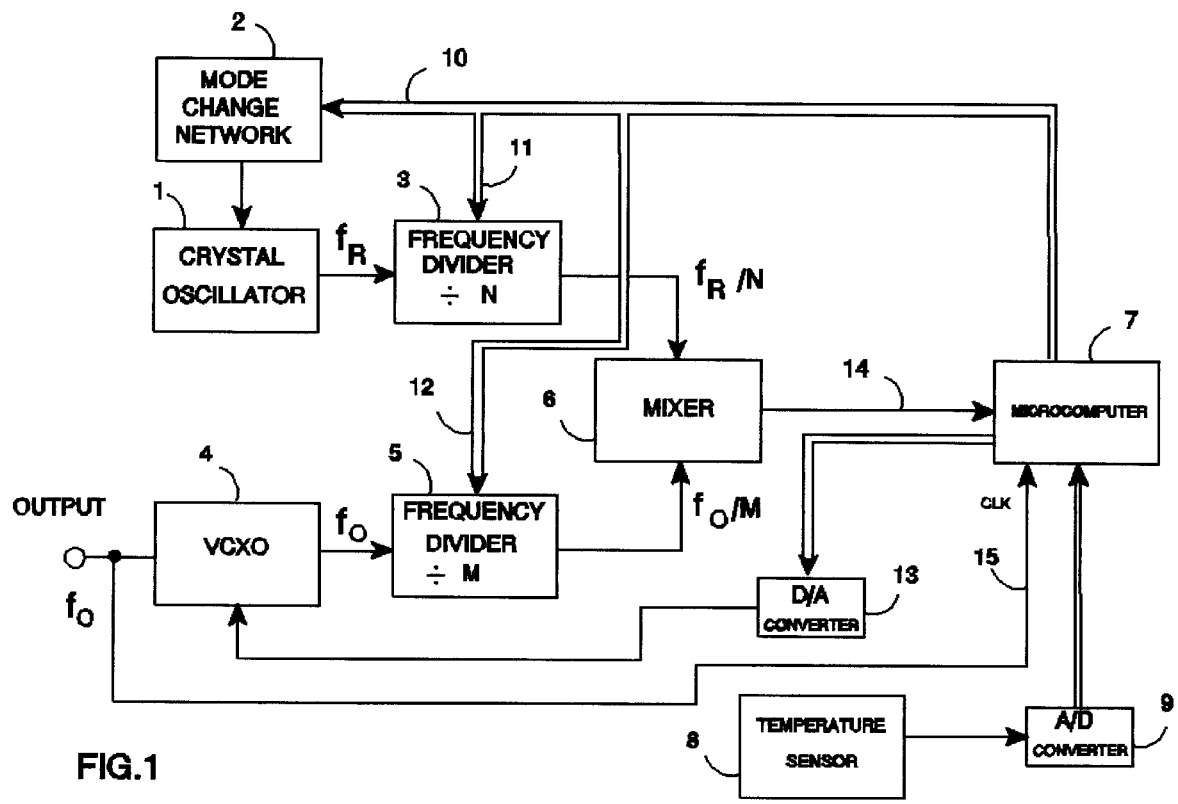
FIG. 1 is a block diagram of the preferred embodiment of a Hysteresis Compensated Crystal Oscillator (HCTCXO)
Figure 2:
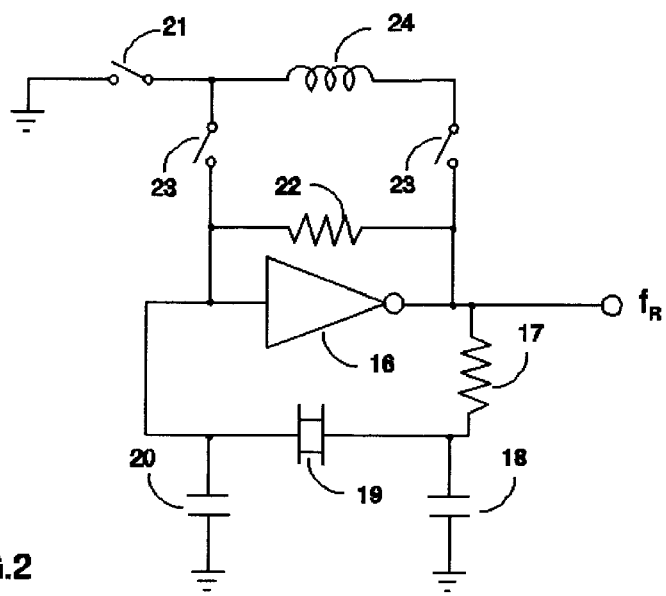
FIG. 2 is a schematic diagram of a sequenced mode oscillator showing a mode change network.
Figure 3:
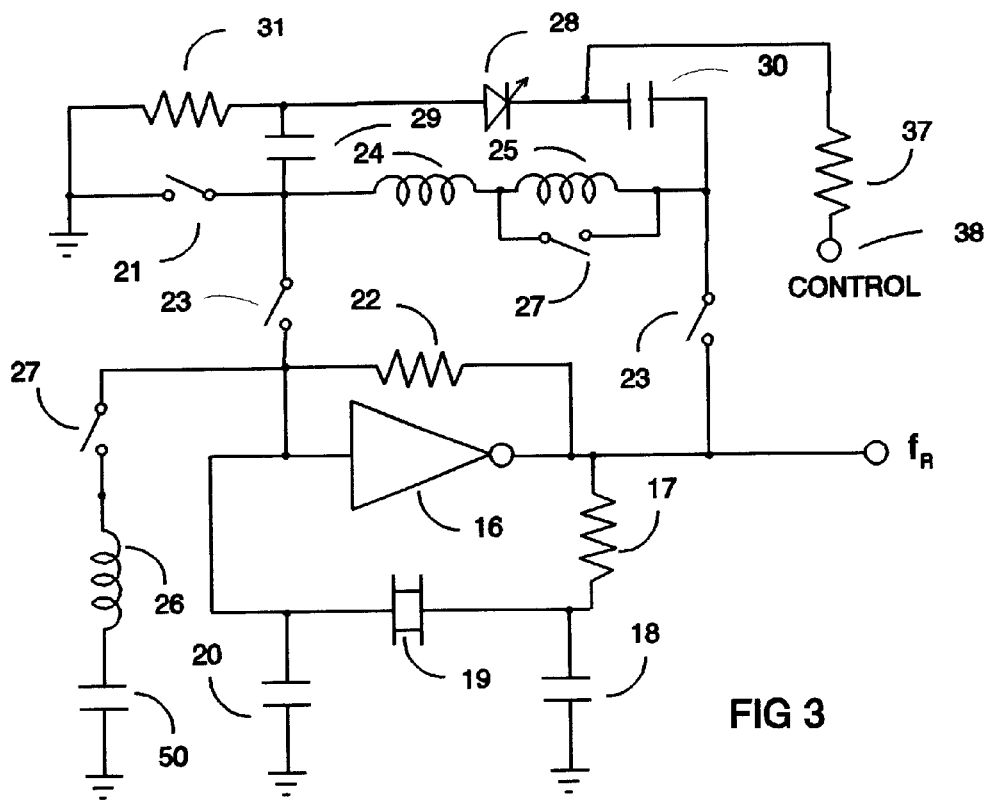
FIG. 3 is the schematic diagram of an alternate reference oscillator implementation.
Figure 4:
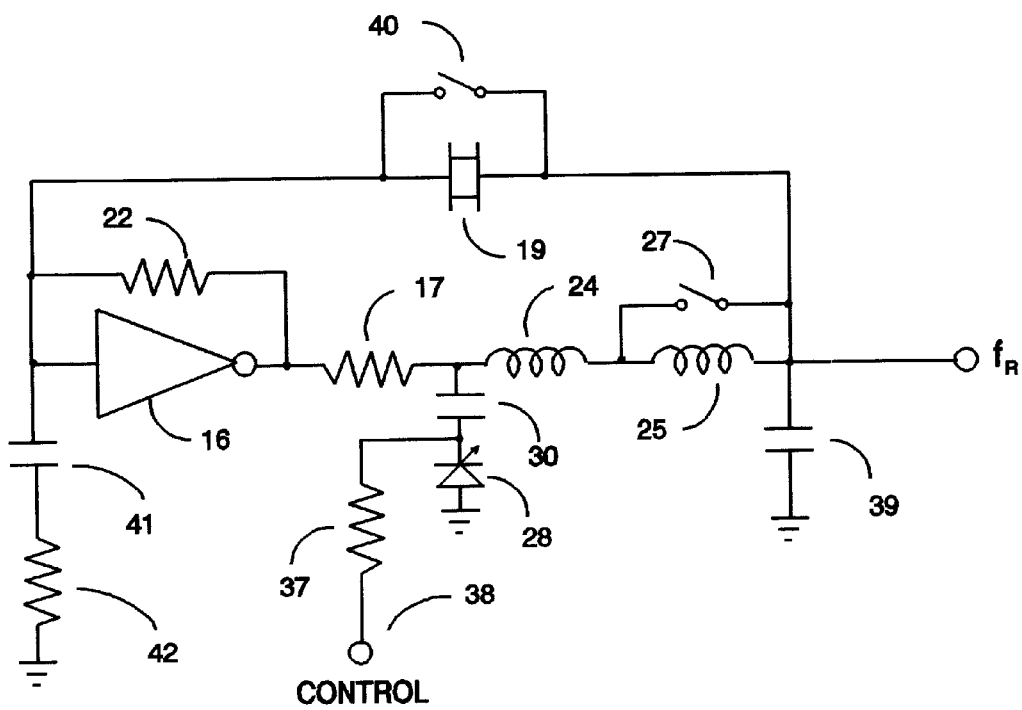
FIG. 4 is a second alternative oscillator implementation with enhanced frequency discrimination capability.
Figure 5:
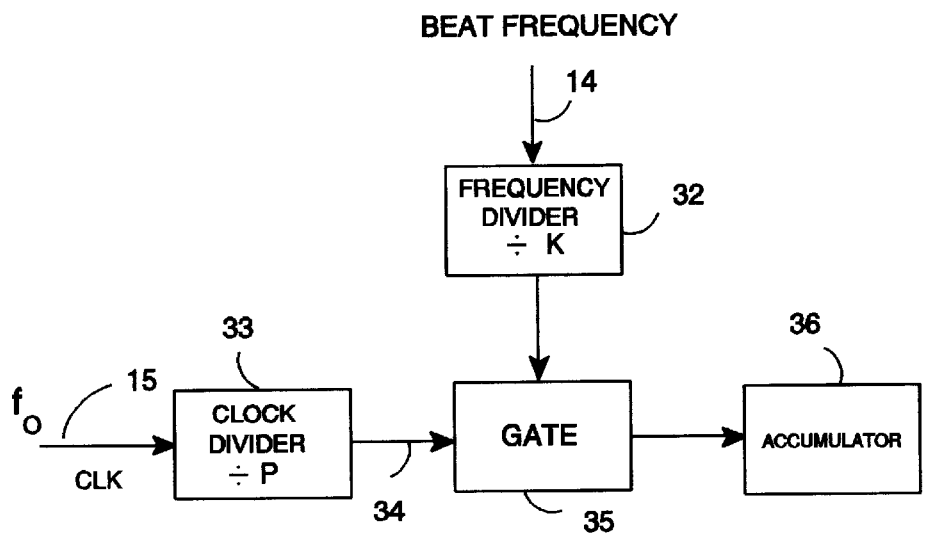
FIG. 5 is a block diagram showing the details of a beat frequency counting circuit.
Figure 6:
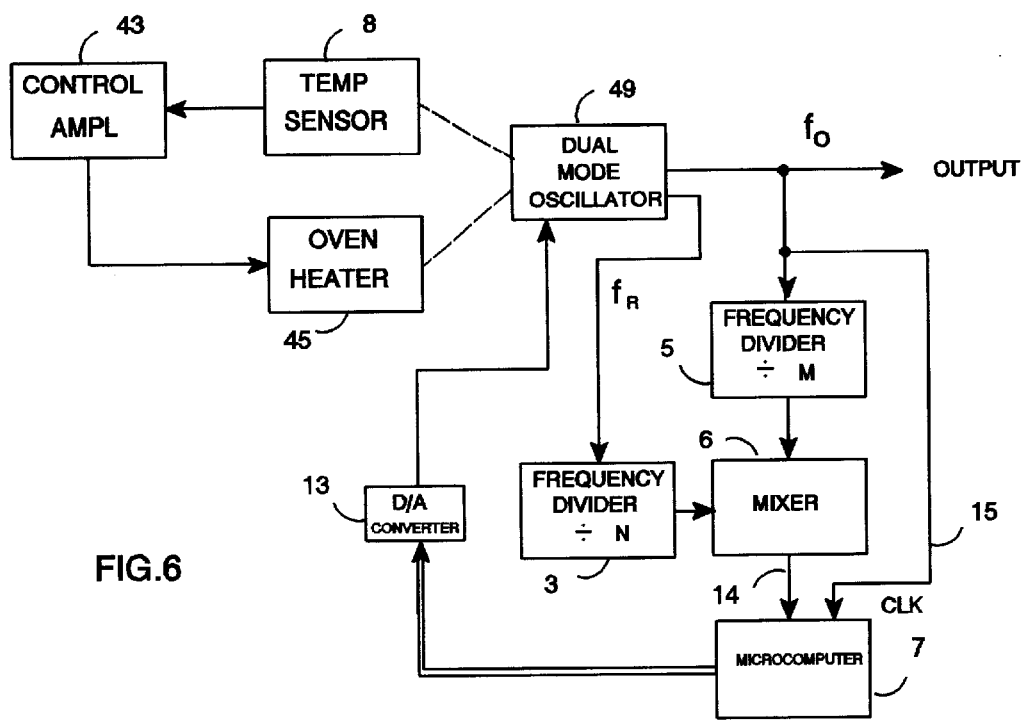
FIG. 6 is a block diagram of an Oven Controlled Crystal Oscillator with residual effect compensation.
Figure 7:
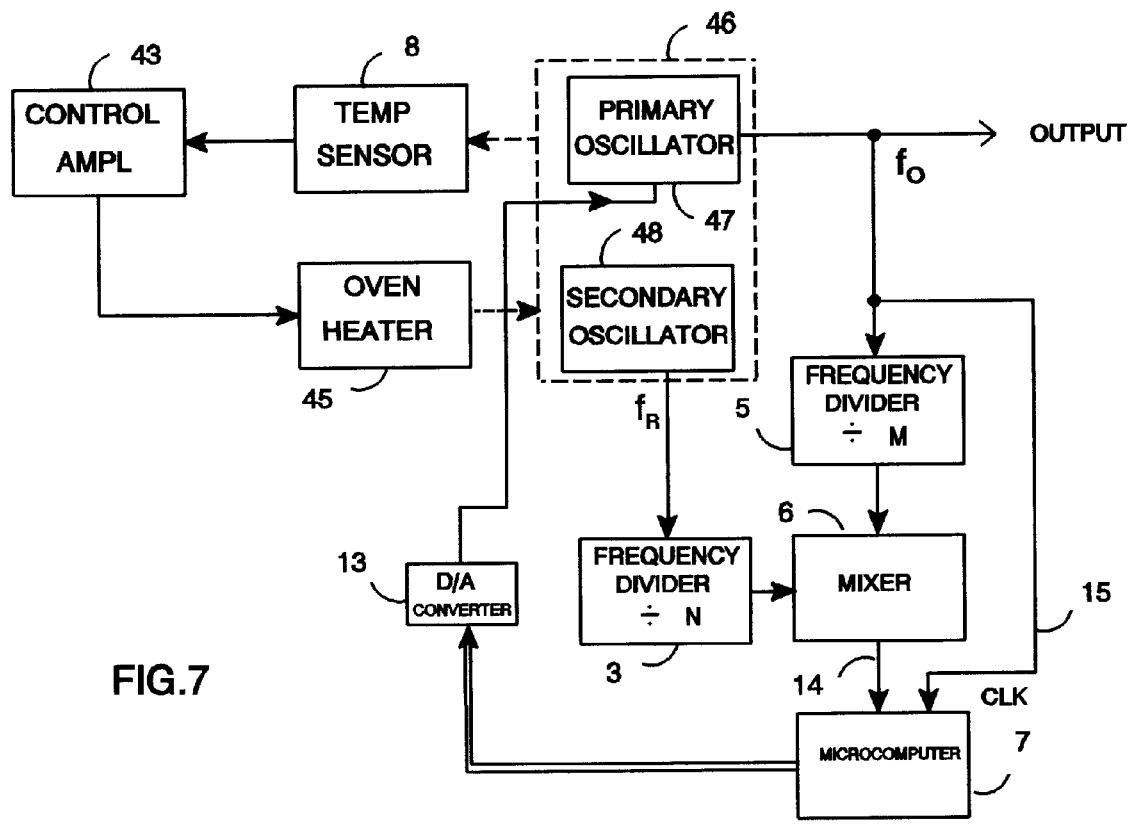
FIG. 7 is a block diagram showing residual effects compensation with multiple oscillators.

A hysteresis corrected temperature compensated crystal oscillator (HCTCXO) is show in FIG. 1. Examples of the mode change network are shown in FIGS. 2, 3, and 4. A detailed drawing of the beat frequency counting circuitry implemented with a microcomputer, is shown in FIG. 5. An oven controlled hysteresis and/or aging compensated crystal oscillator is shown in FIG. 6. An alternate embodiment in which multiple oscillators are used is shown in FIG. 7.

FIG. 1 to which reference should now be made, shows the preferred embodiment of an HCTCXO. It consists of a reference crystal oscillator 1 that can oscillate with different modes of resonance of the crystal as directed by the mode change network 2. Examples of different modes for SC-cut crystals are the fundamental and third overtone C-modes, the fundamental and third overtone B-modes, and the A-modes. The output signal of the reference oscillator, designated $f_R$, is applied to frequency divider 3 to generate a signal of frequency $f_R/N$. N is the desired division ratio which may be selected by microcomputer 7 for the particular crystal mode being excited using control lines 11. Also shown in FIG. 1 is a voltage controlled crystal oscillator (VCXO) 4 that is producing the desired output frequency, $f_o$. Internally in the HCTCXO, the VCXO frequency $f_o$ 15 is applied to frequency divider 5 that produces a divided output frequency $f_o/M$. The division ratio, M, may be selected to be the desired value by microcomputer 7 using control lines 12 for operation with the selected mode of reference oscillator 1.

The two divided signals $f_R/N$ and $f_o/M$ are applied to mixer 6 that produces a beat frequency output with a frequency value ($f_o/M-f_R/N$) or ($f_R/N-f_o/M$) depending on which input frequency is higher. The beat frequency 14 is measured by the microcomputer by counting the number of clock pulses 15 or some submultiple of clock pulses during a specified number of cycles of the beat frequency. An implementation of such a counting apparatus is shown in FIG. 5. The number of cycles is specified by the frequency division ratio K in divider 32 or by programming the microcomputer accumulator to accumulate counts during K cycles of the beat frequency. During this predetermined number of cycles or zero crossings, accumulator 36 accumulates the number of pulses being emitted from clock divider 33. In this system, the frequency, $f_o$, of the VCXO 4 can be calculated from the accumulated count, C, in terms of the reference frequency, $f_R$. The mathematical relationship when the beat frequency is ($f_o/M-f_R/N$) is: $f_o=[f_R/N]/[(1/M)-K/(CP)]$ where N,M, K and P are specified integer division ratios (equation 1).

The accuracy of the frequency determination increases as the beat frequency 14 is reduced. Therefore the integers N and M are judiciously chosen to produce a low beat frequency. A large value of K causes the counts to be accumulated for a longer period of time which also increases accuracy, but the length of the counting time adversely impacts the time that the VCXO must run without new corrections. Therefore it is desirable to choose N and M to minimize the beat frequency. It should also be noted that a direct digital frequency synthesizer (DDS) may be substituted for the frequency dividers if desired to produce a lower beat frequency 14, if integer division ratios are not convenient.

In a conventional TCXO, as described previously in the background section, temperature compensation data is normally stored for only one mode of the crystal; however in the subject invention, such information is stored for at least 2 modes of the crystal. In the preferred embodiment, the third overtone C-mode of an SC-cut crystal is used primarily as the reference crystal, and the third overtone B-mode, which is about 9.5% higher in frequency is used as the differential mode for hysteresis compensation. It should be noted that at certain specific temperatures a particular mode may experience an activity dip and be unusable. If, however, multiple sensing modes are used, e.g. the fundamental and the third overtone B-modes, the activity dips may not occur at exactly the same temperature and at least one compensating mode may always be available. The use of multiple compensating modes also provides opportunities for additional sophistication in the compensation algorithm as described later. This is a specific advantage of the sequenced mode oscillator since it can be made to sequence through many modes. Conversely, if all modes used must be available symultanously as with a dual mode oscillator it becomes difficult to sustain reliable operation over temperature. The temperature error resulting from the time difference between data obtained with sequenced modes measured several seconds apart can be compensated in the microprocessor using a digital delay, e.g. with a digital filter.

A control loop consisting of microcomputer 7 and D/A converter 13 is used to keep the VCXO 4 on frequency using the method as follows: The temperature is first measured using temperature sensor 8, and applied to A/D converter 9. The output of the A/D converter is read into microcomputer 7.

The frequency correction required for the primary reference mode of crystal oscillator 1 due to temperature is then determined from the stored table or by calculating the correction from a power series curve whose coefficients are stored in the memory of microcomputer 7. The frequency of the VCXO 4 is then found by measuring the period of the beat frequency using the accumulator 36 in FIG. 5. Then using equation 1 with the required temperature correction applied to the value of $f_R$ in the equation, the frequency $f_o$ of the VCXO 4 is calculated.

If the frequency of the VCXO 4 is in error by an amount, say $\Delta f1$ then the correction applied to D/A converter 13 is changed by an amount $-\Delta f1$. This can be accomplished by prestoring the sensitivity of the VCXO 4 in the microcomputer 7 and combining it with the correction required. As presently practiced in the art, this correction would now be made to the VCXO 4. According to the subject invention, however, prior to applying this correction, another measurement is now made using a different mode of the reference crystal. The microcomputer changes the mode of oscillator 1 to an alternative mode using control lines 10 to the mode change network 2. Simultaneously the division ratios of the frequency dividers 3 and 5 are changed to reestablish a low value for the beat frequency 14. The frequency of VCXO 4 is then again measured by the period of the beat frequency with accumulator 36 in FIG. 5. The temperature is remeasured as before said. The frequency of the VCXO 4 is then recalculated using equation 1, but this time using the nominal frequency of the alternative mode corrected by the prestored temperature data for that mode. Suppose the calculated frequency of the VCXO 4 is now $\Delta f2$. It is then determined that a differential hysteresis effect $\epsilon=\Delta f1-\Delta f2$ has occurred due to past thermal history of the crystal. The prestored correlation factor, $C_H$, between the C-mode and the differential hysteresis, $\epsilon$, is then applied to the C-mode and the $1^{st}$ calculation repeated but using a value ($f_R+C_H\epsilon$) for $f_R$. Let the frequency error from nominal be $\Delta f'$. The actual correction required by the VCXO 4 is $-\Delta f'$. This value is applied to the D/A converter 13 to pull the VCXO 4 to the correct nominal frequency. It should be noted that the hysteresis correction value, $\epsilon$, is a slowly changing quantity, therefore it may be averaged over a period of time to smooth out noise in the frequency measurements. For example, the smoothing may be accomplished by a low pass filter function so that the value actually used in the VCXO 4 correction is: $\epsilon'(n)=\alpha\epsilon(n)+(1-\alpha)\epsilon'(n-1)$ where $\epsilon(n)$ is the currently measured value and $\epsilon'(n-1)$ is the value used for the VCXO 4 correction at the previous sample time. The value $\alpha$ lies between 0 and 1. A value near 0 implies a great deal of averaging while a value near 1 results in little averaging. If differential hysteresis correction data is available from several modes the value actually used may be a weighted average or some other function of the available correction values.

It should also be apparent that more advanced servo techniques can be used to effect almost continuous tracking of the VCXO frequency rather than only correcting it after each measurement. This is essential if the temperature is changing, since the VCXO frequency would otherwise not remain constant while multiple frequency measurements are being made. A higher order servo loop or a digital algorithm can be used to effect such tracking.

It should be noted that the hysteresis correction method described to the output VCXO is equally applicable to correct for aging effects if aging is the primary constituent in the factor $\epsilon$ or if aging and hysteresis result in approximately the same correlation factor $C_H$. This may occur if the same physical phenomenon is causing the frequency error, e.g. a mounting stress relaxation that affects the two modes by different amounts. If aging and hysteresis affect different sensing modes in different ways, one mode can be used primarily for aging while the other is used primarily for hysteresis.

The correction method can also be used for acceleration compensation to the extent that the effects are different on a plurality of modes.

In the case of aging particularly, it may be advantageous to use two separate oscillators each with its own resonator rather than two modes in the same resonator for the differential frequency. For example, if one resonator is much higher in frequency and hence much thinner than the other, it will be more sensitive to surface effects and be a more effective aging sensor. This is particularly effective if both resonators are packaged in the same enclosure so that similar surface effects occur.

In some cases it may not be desirable or necessary to actually correct the output frequency, but rather to provide a data stream indicating the required correction to the using device such as a frequency synthesizer in a radio receiver or transmitter. In that case the voltage control function of the output oscillator is not required.

It should also be noted that since sequenced multiple modes of oscillation are available, the temperature can be sensed by noting the relative changes in the frequencies of the modes eliminating the need for temperature sensor 8 and A/D converter 9. For example the movement of the fundamental C-mode and third overtone C-modes can be used to measure temperature while the B-modes are used to sense hysteresis or vice versa. Temperature sensing is accomplished by making a separate calculation of $\epsilon$ without applying temperature compensation to the modes. In this case $\epsilon$ can be used as a measure of temperature. The sequenced mode oscillator can also be used without hysteresis correction for simplified less precision applications.

A critical factor in implementing the subject invention when multiple modes are employed is the use of an oscillator circuit that steers the crystal to the different modes of oscillation without itself causing a degeneration in the frequency accuracy. If the oscillations are initiated sequentially, rather than simultaneously, it is also desirable to use an oscillator whose amplitude of oscillation builds up quickly. The oscillator circuit of the preferred embodiment is shown in FIG. 2, to which reference should now be made.

The circuit for sustaining oscillations consists of logic gate 16, crystal 19, series resistor 17, and feedback capacitors 18 and 20. A resistor 22, which has a high value of resistance, biases the inverting CMOS gate 16 into its active region. The gate then provided AC gain with a 180 degree phase shift. The pi network consisting of capacitor 18, crystal 19, and capacitor 20 provides an additional 180 degrees of phase shift and also presents a resistive load to the resistor 17. Thus a total of 360 degrees of phase shift is present causing regenerative oscillations. The resistor 17 effectively increases the output impedance of the gate 16 making the circuit more sensitive to crystal impedance changes and consequently less sensitive to factors affecting the gate 16 such as supply voltage variations. Oscillation builds up until the output voltage of the gate 16 saturates.

The limiting process in gate 16 tends to reduce the AC gain at all frequencies, but the reduction is larger at frequencies other than the one causing the limiting action. Therefore once limiting oscillations are taking place, the mode of oscillation is difficult to change. Consequently, the mode change network consisting of inductor 24 is used only when oscillations are building up. It can then be switched out of the circuit by switches 23 after saturation has taken place. The value of inductor 24 is chosen to be resonant with the series combination of feedback capacitors 18 and 20 and causes a large increase in gain at that frequency so that oscillations buildup quickly and are captured by the desired mode of the crystal. The value of inductor 24 can be varied to select the desired mode by switching in other inductors or by adding series or parallel elements with another switch. This is discussed subsequently in more detail in connection with the alternative oscillators of FIGS. 3 and 4.

It may be necessary to stop the oscillation prior to switching an inductive value to change modes since the limiting process tends to hold the oscillation on the present mode. Oscillations can be quickly stopped in many ways. The method used in the preferred embodiment is to close both switches 23 and 21 simultaneously. In practice, the switches may consist of electronic transmission gates using semiconductor elements. The switches can then easily be controlled by microcomputer 7 (see FIG. 1).

An enhanced method of providing a reference oscillator is shown in FIG. 3 to which reference should now be made. An inverting gate 16 is again shown as the active element with a biasing resistor 22 and a series output resistor 17. Alternatively it is possible to use a single transistor for the active element. The oscillator of FIG. 3 is basically similar to the circuit in FIG. 2 except that the mode change network consists of inductors 24 and 25 and varactor 28 with DC blocking capacitors 29 and 30. A DC voltage is supplied to the varactor through resistors 37 and 31 which also provide RF isolation. The switches 23 are closed during the build-up of oscillations, but may be opened after saturation has occurred. The values of inductors 24 and 25 in series are chosen so that when switches 27 are open the gain enhancement occurs at the fundamental B or C mode as tuned by varactor 28 using control voltage 38. For oscillation on the third overtone modes, switches 27 are closed shorting inductor 25. The value of inductor 24 is chosen to enhance the gain for the third overtone B or C mode as selected by tuning varactor 28 with control voltage 38. A second circuit consisting of inductor 26 and DC blocking capacitor 50 is also added to the circuit to discriminate against the fundamental modes so that the oscillator will not jump to the fundamental modes when the mode change network is disconnected by opening switches 23. This is necessary since the oscillator gain is about 19 db higher at the fundamental frequency and limiting can provide only about 6 db of gain discrimination. This discrimination is effected by establishing a net inductive reactance at the gate input at the fundamental frequency but still allowing it to be capacitive at the third overtone frequency. The oscillation can be quickly stopped preceding mode changes by closing both switches 21 and 23 simultaneously.

An alternative sequenced mode oscillator is shown in FIG. 4. This circuit can provide additional gain enhancement for the desired mode by providing frequency selectivity that remains in the circuit after oscillations have been established. In this circuit, as described previously, gate 16 with its biasing resistor 22 provides gain with 180 degrees of phase shift. Resistor 17 again provides a finite output impedance so that the frequency selection network is more effective. The frequency selection pi network consists of an input capacitance provided by varactor 28 with DC blocking capacitor 30, an inductive reactance provided by inductors 24 and 25, and output capacitance 39. The pi network provides an additional 180 degrees of phase shift. For operation on the fundamental modes, switch 27 is open and the values of inductors 24 and 25 in series are chosen to allow operation of the fundamental B or C modes as tuned by varactor 28 using control voltage 38. For the third overtone modes, switch 27 is closed shorting out inductor 25. The value of inductor 24 is chosen so that either the third overtone B or C modes can be selected by varactor 28 using control voltage 38. A resistor 42 with DC blocking capacitor 41 can be used to provide a more stable input impedance for gate 16.

In order to insure that the selectivity does not degrade the accuracy of the crystal 19, the switch 40 is initially closed shorting our the crystal for a calibration cycle. During this cycle, the frequency counting circuitry, described previously is used to measure the frequency as it is tuned using control voltage 38 which is established by microcomputer 7 using an auxiliary D/A converter. When the exact desired nominal frequency is obtained, the crystal shorting switch, 40 is opened allowing oscillation through crystal 19. Since the Q of the crystal is many orders of magnitude higher than that of inductors 24 and 25, the frequency is then established by the resonant frequency of the crystal 19.

Additional Embodiments

An embodiment of the invention applied to an oven controlled crystal oscillator is shown in FIG. 6 to which reference should now be made. In this case, a dual mode oscillator 49 is used so that oscillations are simultaneously sustained. A dual mode oscillator can be produced in several ways, see for example U.S. Pat. No. 4,872,765. In this case, the third overtone C-mode of the SC-cut crystal produces the output frequency, $f_o$. The third overtone B-mode frequency or the fundamental C-mode may be used to generate the differential frequency, $f_R$, depending on which mode exhibits the greatest correlation between the differential frequency change and the third overtone C-mode hysteresis. The output frequency, $f_o$, is divided by an integer M in frequency divider 5 while the differential mode frequency, $f_R$, is divided by N in frequency divider 3 as discussed with the HCTCXO. The beat frequency is counted by a circuit such as described previously in FIG. 5.

The temperature of the crystal and the oscillator is controlled by the circuit consisting of temperature sensor 8, control amplifier 43, and oven heater 45. If the temperature is below the nominal value, the temperature sensor 8 causes the control amplifier 43 to increase the power supplied to heater 45. Conversely, if the temperature is too high, the power supplied to the heater 45 by amplifier 43 is reduced.

During normal operation, the frequency $f_o$ is calculated with respect to the secondary mode, $f_R$, as given by equation 1 using the nominal value of $f_R$ measured during manufacture of the oscillator. Then if the oven has been turned off and on again or if aging has occurred, the value of the output frequency calculation for $f_o$ will be in error by an amount say $\Delta f$. The prestored hysteresis correction coefficient $C_H$ is applied and a required frequency correction $-(C_H\epsilon)$ is applied to the primary mode, $f_o$, of oscillator 31 by the microcomputer 7 through D/A converter 13. It should be noted that the correction made to the mode generating the output frequency $f_o$ is subtracted from $\epsilon$ in future calculations as well as any effects the correction might have on the sensing mode, $f_R$. In practice, the effects can be combined and a single correction made to $\epsilon$ as a function of the control voltage to oscillator 49.

If aging is the predominant effect, e.g. if the oven is not turned off, the differential frequency change can be used to partially correct for the effects of aging.

Alternative Embodiment

Two independent oscillators each with its own resonator can be used instead of a sequences mode oscillator or a dual mode oscillator. This is shown in FIG. 7 to which reference should now be made. In this case the output frequency is generated by the primary oscillator 47 which is also a VCXO. The output frequency is divided by an integer M in frequency divider 5 while the differential mode frequency, $f_R$, from the secondary oscillator 48 is divided by N in frequency divider 3 as discussed with the HCTCXO. The beat frequency is counted by a circuit such as described previously in FIG. 5.

The oscillators are thermally coupled by oven 46 and maintained at nearly constant temperature by the circuit consisting of temperature sensor 8, control amplifier 43, and oven heater 45 as described above.

During normal operation, the frequency $f_o$ is calculated with respect to $f_R$ as given by equation 1 as described previously with the dual mode oscillator using the nominal value of the secondary oscillator 48 measured during manufacture or calibration of the oscillator. Let the error be $\epsilon=\Delta f$ where $\Delta f$ is the difference between the calculated and nominal values of $f_o$. The prestored correlation coefficient $C_H$ is applied and a required frequency correction ($C_H\epsilon$) is applied to the primary oscillator 47. The applied correction is subtracted from $\epsilon$ in future calculations. If the secondary oscillator 48 is made much higher in frequency, its resonator will be thinner and more sensitive to surface effects causing aging and thus be a more effective aging sensor for the primary oscillator 47. Greatest correlation is obtained if the two resonators are packaged in the same enclosure.

I claim:

1. A system to generate a controlled frequency comprising means to establish multiple modes of resonance in a crystal resonator consisting of an oscillator with mode changing circuitry to sequentially operate the crystal resonator on different modes, and the frequency difference between modes determined indirectly by measuring the frequency of each mode against a secondary oscillator; means for analyzing the frequency difference between the modes; means for applying correction to the output frequency based on the frequency difference between the modes and prestored data on the modes.

2. The controlled frequency system of claim 1 wherein rate of frequency change information is applied to the differential calculations involving the secondary oscillator to compensate for the time difference when measurements are made on various modes.

3. The controlled frequency system of claim 1 in which the mode changing means is switched out of the active circuit after oscillations have been established on the desired mode.

4. The controlled frequency system of claim 1 wherein frequency dividers or a direct digital frequency synthesizer are used to obtain a low beat frequency with a secondary oscillator that can be counted accurately to determine differential frequencies.

5. The controlled frequency system of claim 4 wherein calculating means are used to determine changes in the frequency between the modes based on changes in the beat frequencies.

6. The controlled frequency system of claim 1, wherein said means for generating an output frequency comprises a voltage controlled crystal oscillator which may also serve as the secondary oscillator against which the various modes are measured.

7. The controlled frequency system of claim 1 in which the mode changing circuitry is precalibrated before measuring the frequency of the crystal.

8. The controlled frequency system of claim 1 wherein means are provided to maintain a nearly constant temperature by an oven.

9. The controlled frequency system of claim 1 in which temperature is determined by the difference in frequency between two modes and corrections for temperature are applied to calculations involving the modes.

10. The controlled frequency system of claim 9 in which temperature corrections are applied to various modes and the residual frequency difference between the modes used to correct for frequency hysteresis effects or aging in one of the modes.

11. A controlled frequency system of claim 1 in which an independent temperature sensor is used and temperature corrections applied to the modes used for hysteresis or aging compensation.

12. A device comprising a sequenced mode crystal oscillator; a voltage controlled crystal oscillator; a frequency comparison apparatus; a control microcomputer; software to determine the frequency error in the VCXO based on the frequency difference between the modes of the sequenced mode oscillator and their relationship to the VCXO compared to prestored information; software to control the frequency of the VCXO through a digital to analog converter.

13. The device of claim 12 in which the sequenced mode oscillator contains a mode steering network that is switched out of the circuit after the desired mode of oscillation has been established.

14. The device of claim 12 in which the microprocomputer uses two modes of the sequenced mode oscillator to determine temperature and applies corrections to one of the modes based on prestored temperature compensation data.

15. The device of claim 14 in which the frequency difference between additional modes is used to determine corrections required for frequency hysteresis or aging.

16. The deivce of claim 12 in which rate of change of frequency information is applied to the corrections.

17. The device of claim 12 in which a mixer is used to form the beat frequency between the sequenced mode oscillator and the VCXO.

18. The device of claim 17 in which a reciprocal counter is used to determine the beat frequency.

19. The device of claim 12 in which a timer in the microcomputer is used to determine the period of the beat frequency.

20. A crystal oscillator comprising:

an active element providing gain that is frequency selective due to saturation at one frequency;

a crystal resonator capable of being excited on different modes;

a mode changing network capable of encouraging oscillation on a desired mode or discriminating against an undesired mode;

a switching network used to disconnect the mode change network after saturation has occurred on the desired mode.

* * * * *